(12) United States Patent
Tsai

(10) Patent No.: US 8,124,989 B2
(45) Date of Patent: Feb. 28, 2012

(54) LIGHT OPTOELECTRONIC DEVICE AND FORMING METHOD THEREOF

(75) Inventor: Tzong-Liang Tsai, Taichung (TW)

(73) Assignee: HUGA Optotech Inc., Taichung (TW)

( * ) Notice: Subject to any disclaimer, the term of this patent is extended or adjusted under 35 U.S.C. 154(b) by 219 days.

(21) Appl. No.: 12/061,623

(22) Filed: Apr. 2, 2008

(65) Prior Publication Data

US 2009/0057694 A1  Mar. 5, 2009

(30) Foreign Application Priority Data

Aug. 31, 2007  (TW) ................ 96132383 A

(51) Int. Cl.
*H01L 33/00* (2010.01)

(52) U.S. Cl. .......... 257/94; 257/13; 257/14; 257/15; 257/17; 257/77; 257/79; 257/96; 257/97; 257/99; 257/E33.005; 257/189; 257/197; 438/46

(58) Field of Classification Search .......... 257/183–192
See application file for complete search history.

(56) References Cited

U.S. PATENT DOCUMENTS

| | | | | |
|---|---|---|---|---|
| 4,371,967 A * | 2/1983 | Wada et al. | ................. | 372/45.01 |
| 4,746,181 A * | 5/1988 | Hayakawa et al. | ........... | 385/131 |
| 5,122,845 A | 6/1992 | Manabe et al. | | |
| 5,237,182 A * | 8/1993 | Kitagawa et al. | ............... | 257/15 |
| 5,260,959 A * | 11/1993 | Hayakawa | ................ | 372/45.01 |
| 5,289,484 A * | 2/1994 | Hayakawa | ................ | 372/45.01 |
| 5,290,393 A | 3/1994 | Nakamura | | |
| 5,296,718 A * | 3/1994 | Fujita et al. | ...................... | 257/14 |
| 5,466,950 A * | 11/1995 | Sugawara et al. | ............... | 257/94 |
| 5,732,098 A * | 3/1998 | Nisitani et al. | ............. | 372/45.01 |
| 5,751,753 A * | 5/1998 | Uchida | ..................... | 372/45.012 |
| 5,874,747 A * | 2/1999 | Redwing et al. | ................ | 257/77 |
| 5,889,806 A * | 3/1999 | Nagai et al. | ................ | 372/45.01 |
| 5,900,650 A * | 5/1999 | Nitta | ............................. | 257/94 |
| 5,901,165 A * | 5/1999 | Uchida | ..................... | 372/45.01 |
| 5,909,040 A | 6/1999 | Ohba et al. | | |
| 5,929,466 A | 7/1999 | Ohba et al. | | |
| 5,990,500 A * | 11/1999 | Okazaki | ......................... | 257/99 |
| 6,020,601 A * | 2/2000 | Noguchi et al. | ................ | 257/96 |
| 6,127,691 A * | 10/2000 | Fukunaga et al. | ............. | 257/17 |
| 6,337,493 B1 * | 1/2002 | Tanizawa et al. | ............. | 257/79 |
| 6,345,063 B1 * | 2/2002 | Bour et al. | ................. | 372/45.01 |
| 7,039,078 B2 * | 5/2006 | Matsuoka et al. | ............. | 372/26 |

(Continued)

FOREIGN PATENT DOCUMENTS

TW  200707805  2/2007

*Primary Examiner* — Victor A Mandala
*Assistant Examiner* — William Harriston
(74) *Attorney, Agent, or Firm* — Jianq Chyun IP Office

(57) ABSTRACT

The present invention provides an optoelectronic device with an epi-stacked structure, which includes a substrate, a buffer layer that is formed on the substrate, in which the buffer layer includes a first nitrogen-containing compound layer, an II/V group compound layer is provided on the first nitrogen-containing compound layer, a second nitrogen-containing compound layer is provided on the II/V group compound layer, and a third nitrogen-containing compound layer is provided on the second nitrogen-containing compound layer, an epi-stacked structure with a multi-layer structure is formed on the buffer layer, which includes a first semiconductor conductive layer is formed on the buffer layer, an active layer is formed on the first semiconductor conductive layer, a multi-layer structure is formed between the first semiconductor conductive layer and the active layer, and a second semiconductor conductive layer is formed on the active layer.

11 Claims, 13 Drawing Sheets

U.S. PATENT DOCUMENTS

| | | |
|---|---|---|
| 7,067,838 B1 * | 6/2006 | Sato et al. .................. 257/17 |
| 7,083,996 B2 * | 8/2006 | Nagahama et al. .......... 438/46 |
| 7,365,369 B2 * | 4/2008 | Nakamura et al. .......... 257/97 |
| 2002/0163014 A1 * | 11/2002 | Welser et al. ............... 257/197 |
| 2005/0129078 A1 * | 6/2005 | Johnson ...................... 372/50 |
| 2006/0049417 A1 * | 3/2006 | Li et al. ...................... 257/96 |
| 2006/0049418 A1 * | 3/2006 | Wen et al. ................... 257/98 |
| 2006/0118820 A1 * | 6/2006 | Gaska et al. ................ 257/189 |
| 2006/0246700 A1 * | 11/2006 | Johnson ...................... 438/606 |
| 2007/0181869 A1 * | 8/2007 | Gaska et al. ................ 257/14 |
| 2009/0026440 A1 * | 1/2009 | Kyono et al. ............... 257/13 |
| 2009/0127572 A1 | 5/2009 | Tanaka et al. |

* cited by examiner

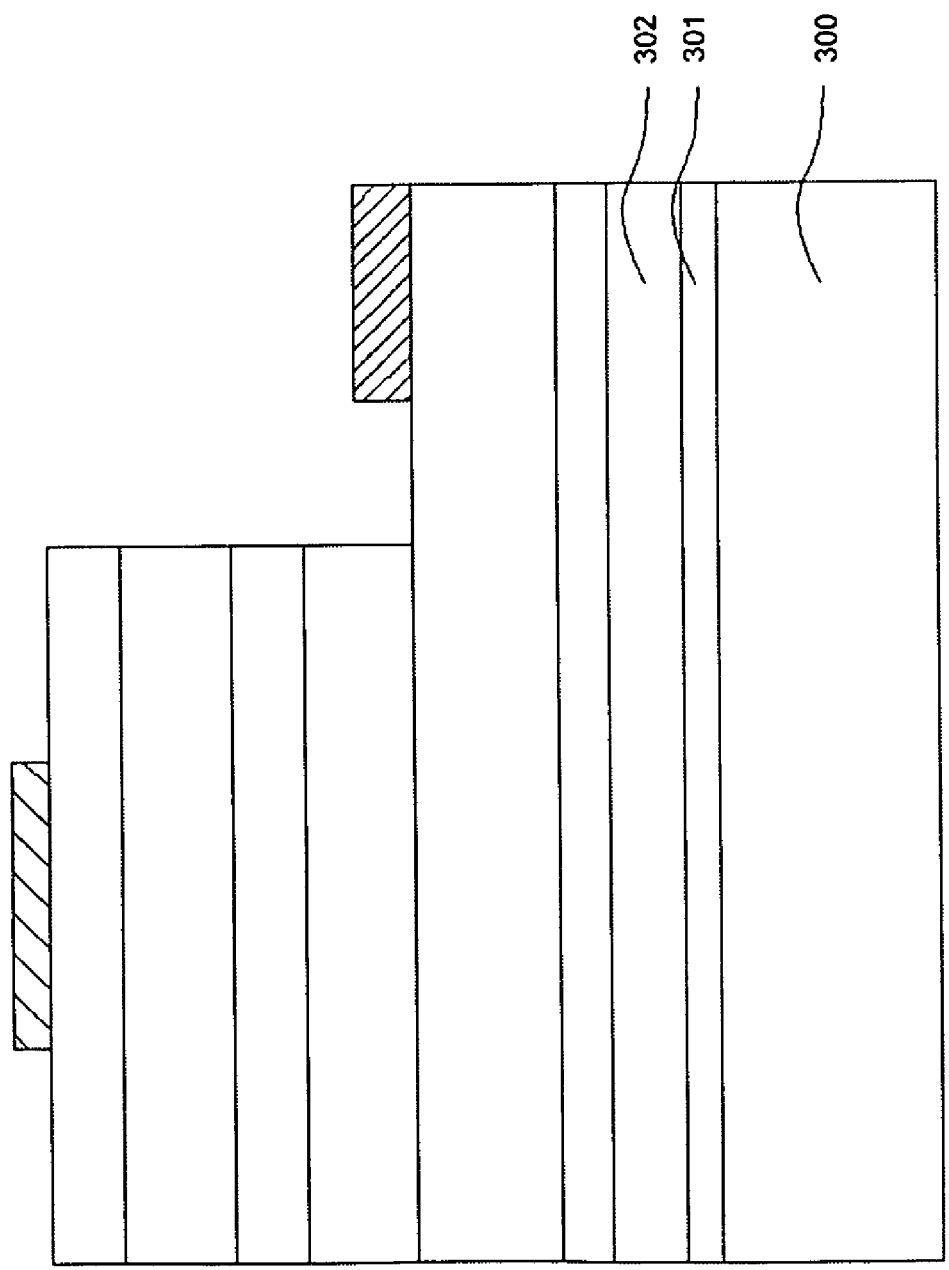

LIGHT OPTOELECTRONIC DEVICE AND FORMING METHOD THEREOF

BACKGROUND OF THE INVENTION

1. Field of the Invention

The present invention is related to an optoelectronic device, especially related to an optoelectronic device having a multi-layer structure of epi-stacked structure for the enhancement of optoelectronic efficiency.

2. Description of the Prior Art

The crystal property of GaN compound needs to be improved for providing a solution on the issue of lattice matching between sapphire and GaN in an active layer. In U.S. Pat. No. 5,122,845, shown in FIG. 1, an AlN-based buffer layer 101 is formed between a substrate 100 and GaN compound layer 102, which is microcrystal or polycrystal to improve crystal mismatching between the substrate 100 and the GaN compound layer 102. In U.S. Pat. No. 5,290,393, shown in FIG. 2, an optoelectronic device is a GaN-based compound semiconductor layer 202, such as $Ga_xAl_{1-x}N$ ($0<x\leq1$). However, during the formation of a compound semiconductor layer 202 on a substrate 200 by epi-growth, the lattice structure on the surface of the substrate 200 may influence the quality of a sapphire device. Thus, a buffer layer 201, such as $Ga_xAl_{1-x}N$, is between the substrate 200 and the compound semiconductor layer 202 to improve lattice mismatching. Furthermore, in U.S. Pat. No. 5,929,466 or 5,909,040, shown in FIG. 3, an AlN layer 301 as a first buffer layer is formed on a substrate 300, an InN layer 302 as a second buffer layer is on the AlN layer 301, which may improve lattice mismatching near the substrate 300. However, the optoelectronic efficiency is restricted by the methods aforementioned. Thus, the present invention provides an optoelectronic device which includes a buffer layer with easily-growing II/V group compound layer associated with uneven surface of an active layer. Thus, the light brightness of the optoelectronic device is improved.

SUMMARY OF THE INVENTION

Accordingly, the present invention provides an optoelectronic device with the epi-stacked structure of a multi-layer structure for the reduction on the internal defect in the active layer and the light-emitting efficiency of the active layer.

Furthermore, the present invention provides an optoelectronic device with the epi-stacked structure of a multi-layer structure. The average energy gap of strain-releasing in the multi-layer structure is not equal to the energy gap of an active layer for mismatch reduction between the active layer and a first semiconductor conductive layer.

Accordingly, the present invention provides an optoelectronic device with an epi-stacked structure. The optoelectronic device with an epi-stacked structure includes: a substrate; a buffer layer formed on the substrate; and an epi-stacked structure formed on the substrate. The epi-stacked structure includes a first semiconductor conductive layer, an active layer, a multi-layer structure between the first semiconductor conductive layer and the active layer, and a second semiconductor conductive layer. The multi-layer structure includes a first semiconductor structure layer, a second semiconductor structure layer and a third semiconductor structure layer, which is stacked on the first semiconductor conductive layer.

The present invention provides an optoelectronic device with an epi-stacked structure. The optoelectronic device with an epi-stacked structure includes: a substrate; a first semiconductor conductive layer formed on the substrate and having a first portion and a second portion; a multi-layer structure formed on the first portion of the first semiconductor conductive layer; wherein the multi-layer structure has at least a first semiconductor conductive layer, a second semiconductor conductive layer and a third semiconductor conductive layer; an active layer formed on the multi-layer structure; and a second semiconductor conductive layer formed on the active layer. The multi-layer semiconductor structure layer includes at least a plurality of first semiconductor structure layers, second semiconductor structure layers and third semiconductor structure layers. Each of the second semiconductor structure layers is stacked between each of the first semiconductor structure layers and each of the third semiconductor structure layers. The multi-layer semiconductor structure layer having multiple first/second/third semiconductor structure layers is formed between the first semiconductor conductive layer and the active layer.

The present invention provides an optoelectronic device. The optoelectronic device includes: a first electrode; a substrate formed on the first electrode; an epi-stacked structure with a multi-layer structure having: a first semiconductor conductive layer formed on the substrate; and a multi-layer semiconductor structure layer formed on the first semiconductor conductive layer; the multi-layer semiconductor structure layer having: a first semiconductor structure on the first semiconductor conductive layer; a second semiconductor structure formed on the first semiconductor structure; and a third semiconductor structure formed on the second semiconductor structure; an active layer formed on the multi-layer semiconductor structure layer; a transparent conductive layer formed on the active layer; and a second electrode formed on said transparent layer. The multi-layer semiconductor structure layer includes at least a plurality of first semiconductor structure layers, second semiconductor structure layers and third semiconductor structure layers. Each of the second semiconductor structure layers is stacked between each of the first semiconductor structure layers and each of the third semiconductor structure layers. The multi-layer semiconductor structure layer having multiple first/second/third semiconductor structure layers is formed between the first semiconductor conductive layer and the active layer.

BRIEF DESCRIPTION OF THE DRAWINGS

FIG. 3 is a cross-sectional diagram illustrating an epitaxy wafer in accordance with a prior art.

DESCRIPTION OF THE PREFERRED EMBODIMENT

The present invention provides an optoelectronic device and the fabrication thereof. Following illustrations describe detailed optoelectronic device and the fabrication thereof for understanding the present invention. Obviously, the present invention is not limited to the embodiments of optoelectronic device; however, the preferable embodiments of the present invention are illustrated as followings. Besides, the present invention may be applied to other embodiments, not limited to ones mentioned.

Figure 1:
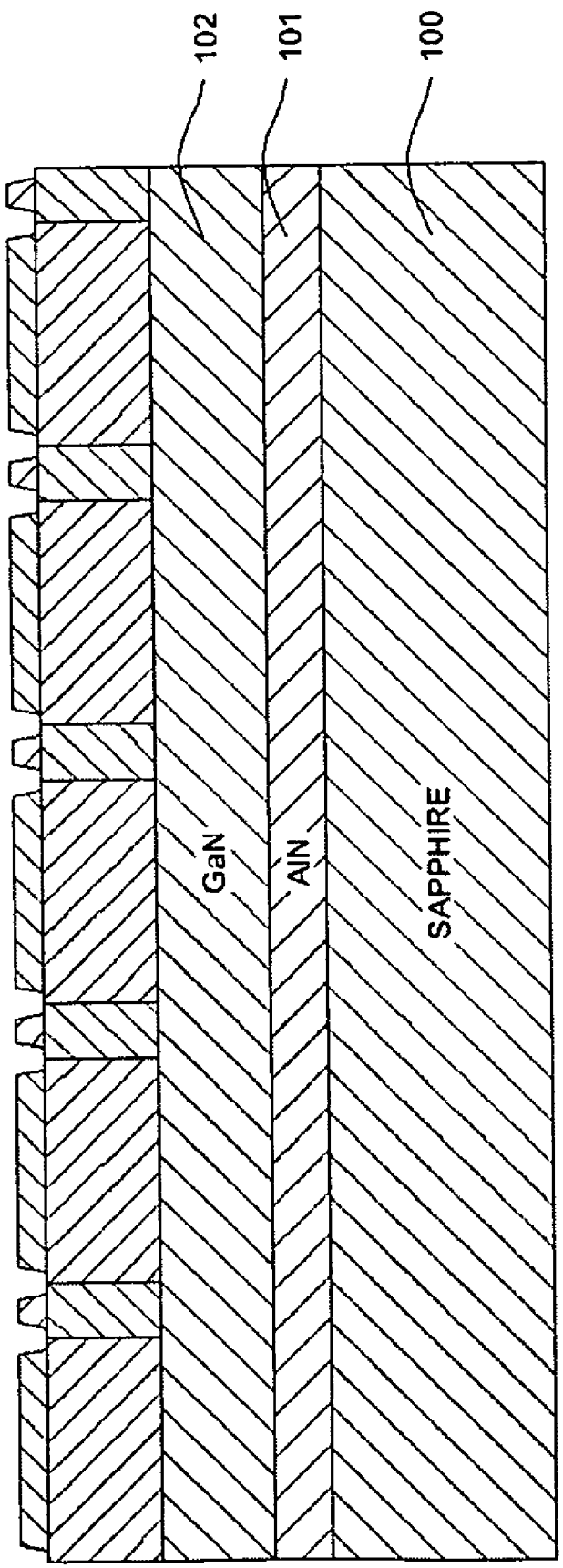
FIG. 1 is a cross-sectional diagram illustrating an optoelectronic semiconductor device in accordance with a prior art.
Figure 2:
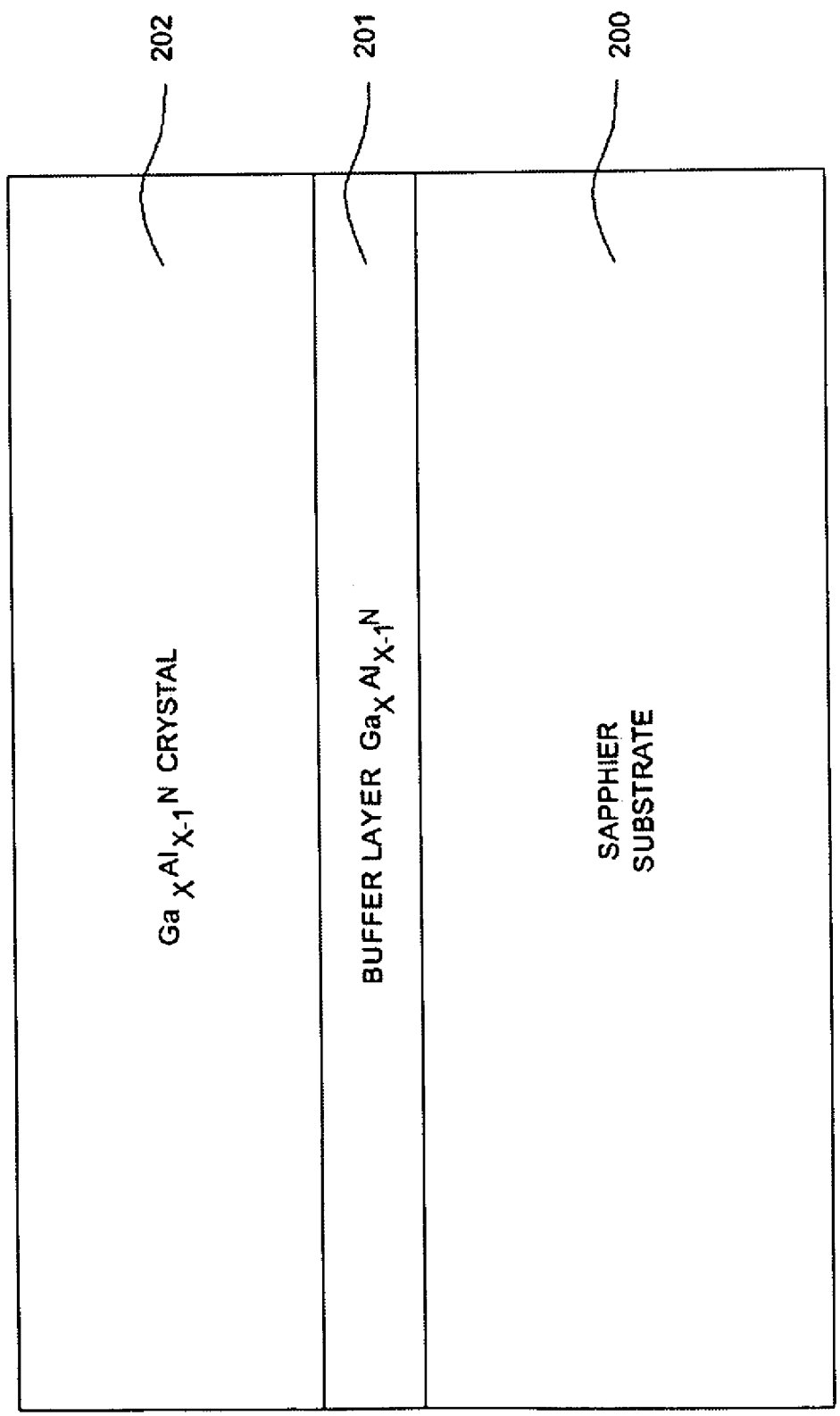
FIG. 2 is a cross-sectional diagram illustrating an epitaxy wafer in accordance with a prior art.
Figure 4A:
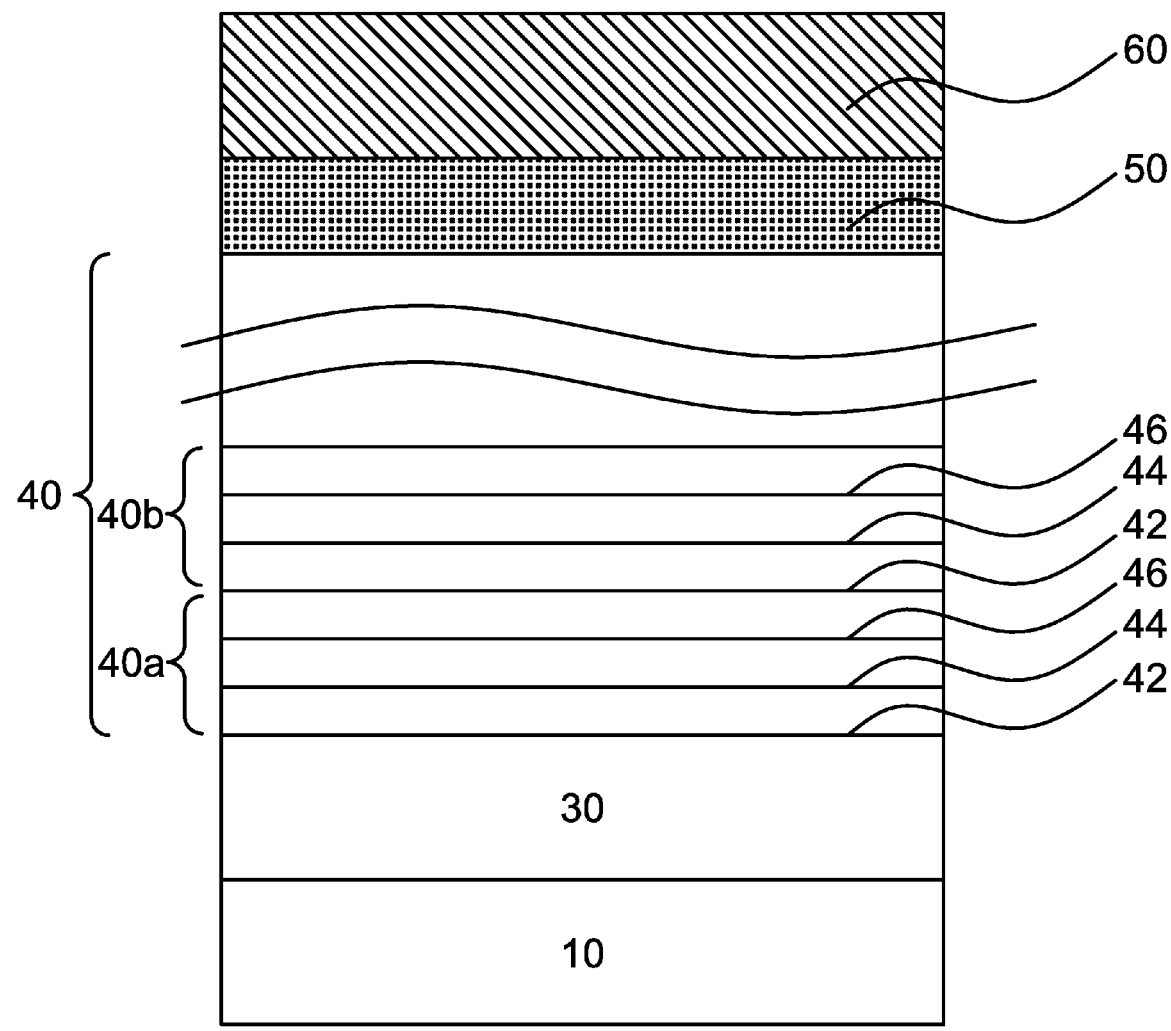
FIG. 4A and FIG. 4B are cross-sectional diagrams illustrating semiconductor structures with epi-stacked structures in accordance with the present invention.
Figure 4B:
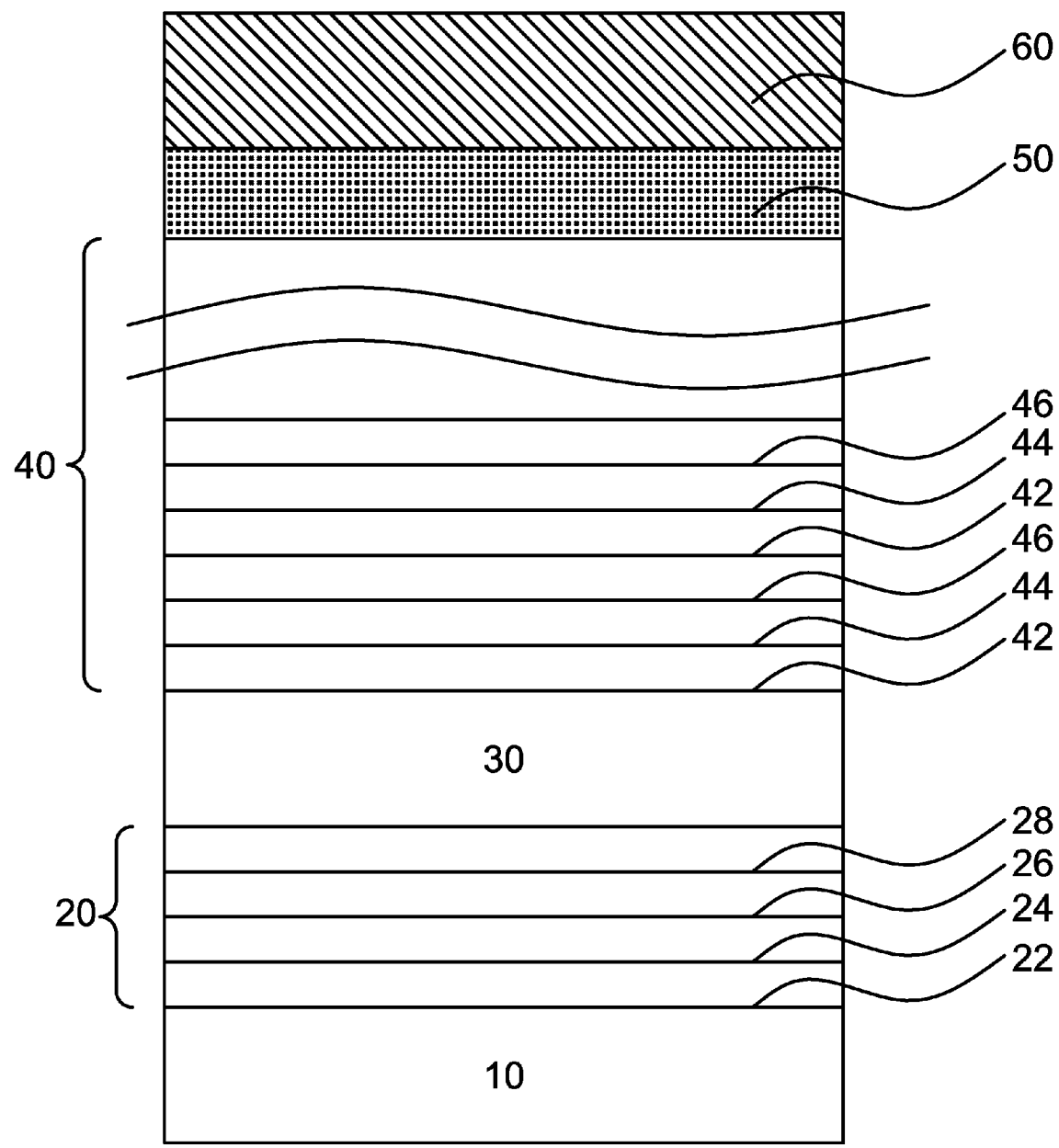

FIG. 4A and FIG. 4B are cross-sectional diagrams illustrating two semiconductor structures with two epi-stacked structures in accordance with the present invention. As shown in FIG. 4A, a substrate 10 is provided which is made of a material selected from the group consisting of: sapphire, $MgAl_2O_4$, GaN, AlN, SiC, GaAs, AlN, GaP, Si, Ge, ZnO, MgO, LAO, LGO and glass material.

Next, an epi-stacked structure with a multi-layer structure is formed on the substrate 10. One exemplary epi-stacked structure includes a first semiconductor conductive layer 30, a multi-layer semiconductor structure layer 40, an active layer 50 and a second semiconductor conductive layer 60. The first semiconductor conductive layer 30 is formed on the substrate 10 and the multi-layer semiconductor structure layer 40 is on the first semiconductor conductive layer 30, the active layer 50 on the multi-layer semiconductor structure layer 40 and the second semiconductor conductive layer 60 on the active layer 50. It is noted that the multi-layer semiconductor structure layer 40 is alternatively formed on the active layer 50 for the enhancement of light-emitting efficiency. However, the structure and merits are not repeated herein.

In the embodiment, the multi-layer semiconductor structure layer 40 is provided with strain-releasing regions, which is with an average energy gap (Eg) (SRS: strain releasing structure) different from (not equal to) the energy gap ($Eg_{active}$) of the active layer 50, that is, ($Eg_{(avg,SRS)}$)≠($Eg_{,active}$). Thus, with the formation of the multi-layer semiconductor structure layer 40 between the first semiconductor conductive layer 30 and the active layer 50, the internal defect in the active layer 50 may be decreased, especially when the active layer 50 is based on a multi quantum well (MQW). Moreover, the formation of the multi-layer semiconductor structure layer 40 not only improves the light efficiency of the active layer 50 but also reduce the crystal mismatching between the active layer 50 and the first semiconductor conductive layer 30. Furthermore, the multi-layer semiconductor structure layer 40 may be as a distributed Bragg reflector (DBR) for the improvement of light-emitting efficiency.

It is noted that the multi-layer semiconductor structure layer 40 includes a plurality of stacked layers. In the embodiment, a first multi-layer structure 40a and a second multi-layer structure 40b are respectively consisted of a first semiconductor structure layer 42, a second semiconductor structure layer 44 and a third semiconductor structure layer 46. The second multi-layer structure 40b is above the first multi-layer structure 40a. Accordingly, more multi-layer structures 40c, 40d and so on (not shown in the figure) may be stacked above the second multi-layer structure 40b. However, the suggested stacking thickness may be less than or equal to 1 um, or a better thickness is about 500 nm and the preferred one is 200 nm. Furthermore, the first semiconductor structure layer 42, the second semiconductor structure layer 44 and the third semiconductor structure layer 46 are respectively GaN layer, AlGaN layer and InGaN layer. It is noted that the Al amount in the second semiconductor structure layer 44 may improve the ESD efficiency of such a structure and reduce IR.

In the embodiment, the average energy gap ($Eg_{(avg,SRS)}$) of the multi-layer semiconductor structure layer 40 is acquired from the first semiconductor structure layer 42 with the first energy gap $Eg_1$ of 3.1 eV and the thickness $t_1$ of 2 nm, the second semiconductor structure layer 44 with the second energy gap $Eg_2$ of 3.647 eV and the thickness $t_2$ of 2 nm and a third semiconductor structure layer 46 with the third energy gap $Eg_3$ of 3.34 eV and the thickness $t_3$ of 2 nm. Thus, the average energy gap ($Eg_{(avg,SRS)}$) of the multi-layer semiconductor structure layer 40 is calculated by the following equation:

$$Eg(avg, SRS) = \frac{(t_1 Eg_1 + t_2 Eg_2 + t_3 Eg_3)}{t_1 + t_2 + t_3}$$

Accordingly, the average energy gap ($Eg_{(avg,SRS)}$) of the multi-layer semiconductor structure layer 40 is 3.362 eV. On the other hand, the energy gap of the active layer 50 is 2.696 eV, which is smaller than the one of the multi-layer semiconductor structure layer 40.

Furthermore, in the embodiment, the first semiconductor conductive layer 30 may be an N-type semiconductor layer and the second semiconductor conductive layer 60 may be a P-type one. The active layer 50 may be InGaN layer, multi quantum well (MQW) and a quantum well (QW).

Thus, shown in FIG. 4A, during the formation of fundamental semiconductor structure of an optoelectronic device, N-type semiconductor conductive layer (first semiconductor conductive layer) 30 and P-type semiconductor conductive layer (second semiconductor conductive layer) 60 are formed around the active layer 50. When biased with a suitable voltage, the electrons in the N-type first semiconductor conductive layer 30 and electrical holes in the P-type second semiconductor conductive layer 60 may be driven into the active layer 50 where they are then recombined to emit light. Alternatively, the epi-stacked structure of the exemplary optoelectronic device may be used as LED, laser, photodetector, or VCSEL, and so on.

Furthermore, the buffer layer 20 is alternatively formed on the substrate 10. Thus, shown in FIG. 4B, in the other embodiment, a substrate 10 of sapphire is put in MOVPE and a buffer layer 20 is formed on the substrate 10. The buffer layer 20 is a multi-strain releasing layer for acquiring a GaN layer in good quality. In the embodiment, the buffer layer 20 has first gallium nitride based compound layer 22, a II/V group compound layer 24, a second gallium nitride based compound layer 26 and a third gallium nitride based compound layer 28.

The first nitride-containing compound layer 22 is on the substrate 10, which is $Al_xIn_yGa_{1-x-y}N$ layer where x≧0, y≧0 and 0≦x+y≦1. Next, the II/V group compound layer 24 is formed on the first gallium nitride based compound layer 22, which has the material of II group selected from the group consisting of: Be, Mg, Ca, Sr, Ba, Ra, Zn, Cd and Hg, and the material of V group selected from the group consisting of: N, P, As, Sb and Bi. Accordingly, the V-II group compound layer 24 may be made of the aforementioned materials combined.

In the embodiment, for the V-II group compound layer 24, an Mg-contained precursor such as $DCp_2Mg$(bis(cyclopentadienyl)Magnesium) or Bis(methylcyclopentadienyl)Magnesium is put in a reactive chamber which $NH_3$ is leaded in. Then, an $Mg_xN_y$ layer is formed by MOCVD. Thus, the $Mg_xN_y$ layer of the thickness 10 angstroms, which is as the II/V group compound layer 24, is located on the first gallium nitride based compound layer 22 and has a roughness smaller than 10 nanometers. In a preferred embodiment, the II/V group compound layer 24 has a suitable roughness of about 2 nanometers to continuously grow on the first gallium nitride based compound layer 22. Furthermore, the II/V group compound layer 24 has band-gap energy smaller than a conventional II-V group compound. For example, the material of II/V group compound is, such as $Zn_3As_2$ with the band-gap energy of 0.93 eV, $Zn_3N$ with the band-gap energy of 3.2 eV, $Zn_3P_3$ with the band-gap energy of 1.57 eV, and $Mg_3N_2$ with the band-gap energy of 2.8 eV. However, the conventional II-V group compound, such as GaN, has the band-gap energy of 3.34 eV. Accordingly, the II/V group compound layer 24 has better ohmic contact.

Next, the second nitride-containing compound layer 26 and the third gallium nitride-containing compound layer 28 are formed on the II/V group compound layer 24. In the embodiment, the second nitride-containing compound layer 26 is a GaN based layer, such as AlGaN compound layer. The third nitride-containing compound layer 28 at least includes a semiconductor structure with an $Al_xIn_yGa_{1-x-y}N$ layer where $x \geq 0$, $y \geq 0$ and $0 \leq x+y \leq 1$ and is formed at the temperature from 900° C. to 1300° C. Compared with the epi-temperature of the first and second gallium nitride based compound layers 22 and 26, the third nitride-containing based compound layer 28 is formed at a higher temperature. Thus, the buffer layer 20 consisting of the first gallium nitride based compound layer 22, the II/V group compound layer 24, the second nitride-containing compound layer 26 and the third nitride-containing compound layer 28 is a multi-strain releasing layer for reducing strain between the substrate 10 and an epi-stacked structure thereon and acquiring the epi-stacked structure in good quality.

Figure 5A:
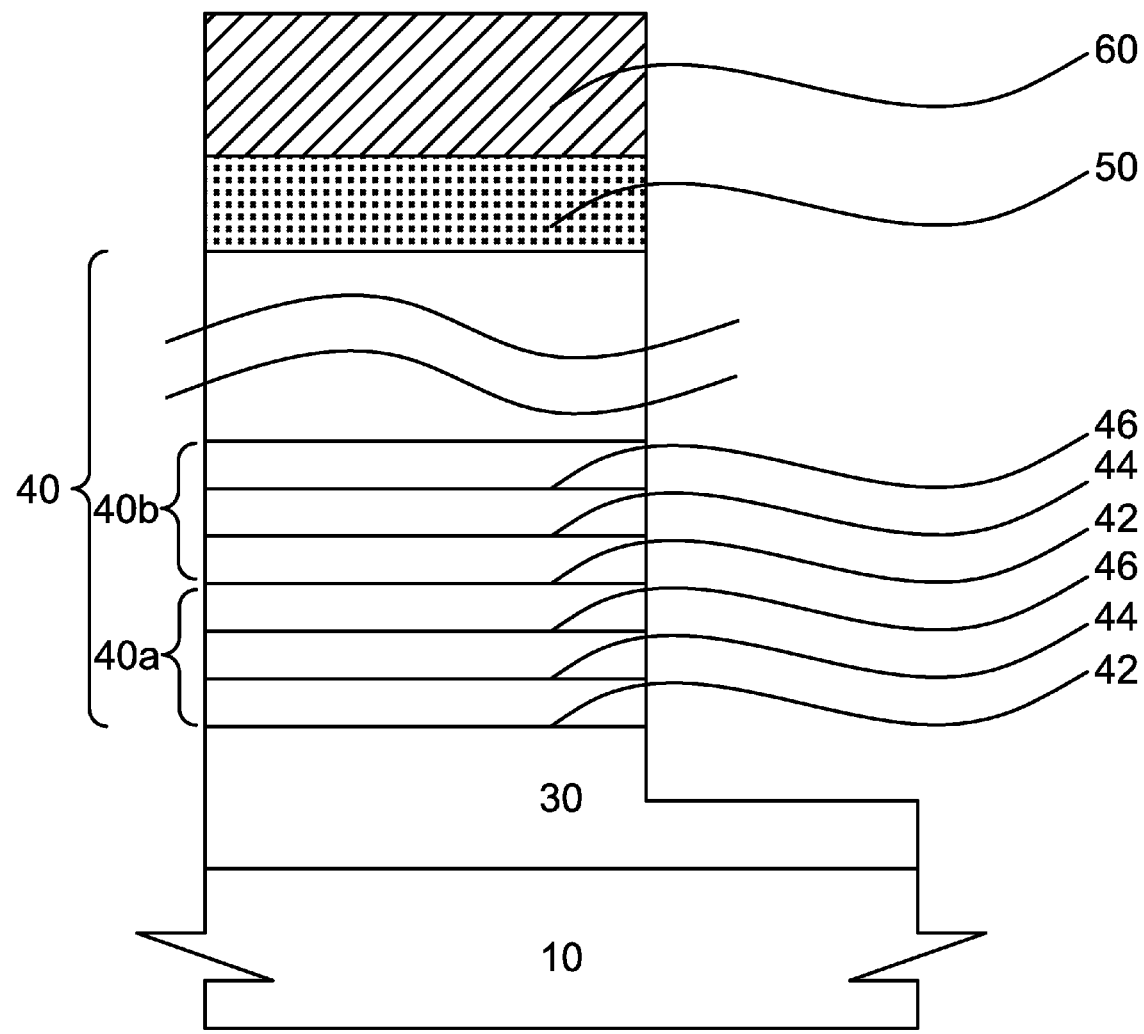
FIG. 5A and FIG. 5B are cross-sectional diagrams illustrating semiconductor structures with epi-stacked structures in accordance with the present invention.

Next, referring to FIG. 5A is another cross-sectional diagram illustrating an epi-stacked structure of a multi-layer semiconductor structure in accordance with the present invention. It is noted that the material characteristics, formation and the structures in FIG. 5A are identical to the ones in FIG. 4A and not repeated. The differences in FIG. 5A and FIG. 4A are that the portions of the second semiconductor conductive layer 60, the active layer 50 the multi-layer semiconductor structure layer 40 and the first semiconductor conductive layer 30 are etched for removal to expose the portion (the second portion) first semiconductor conductive layer 30, after the first semiconductor conductive layer 30, the multi-layer semiconductor structure layer 40, the active layer 50 and the second semiconductor conductive layer 60 are formed on the substrate 10.

Figure 5B:
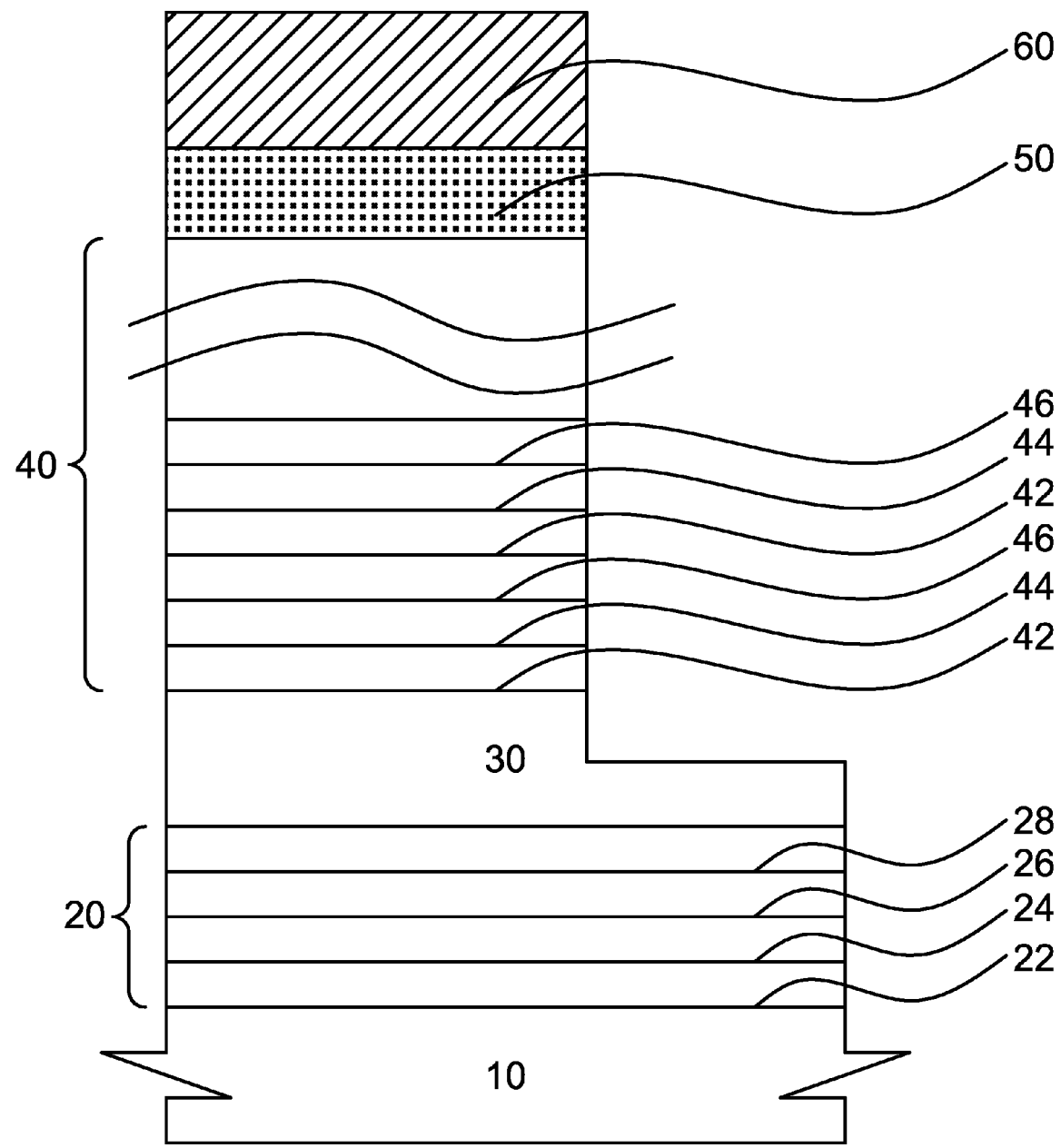

Next referring to FIG. 5B, similar to FIG. 4B, the buffer layer 20 is formed on the substrate 10. Next, the first semiconductor conductive layer 30, the multi-layer semiconductor structure layer 40, the active layer 50 and the second semiconductor conductive layer 60 are formed on the buffer layer 20 by epi-growth method. Similarly, the portions of the second semiconductor conductive layer 60, the active layer 50 of the multi-layer semiconductor structure layer 40 and the first semiconductor conductive layer 30 are etched for removal to expose the portion (the second portion) first semiconductor conductive layer 30.

Figure 6A:
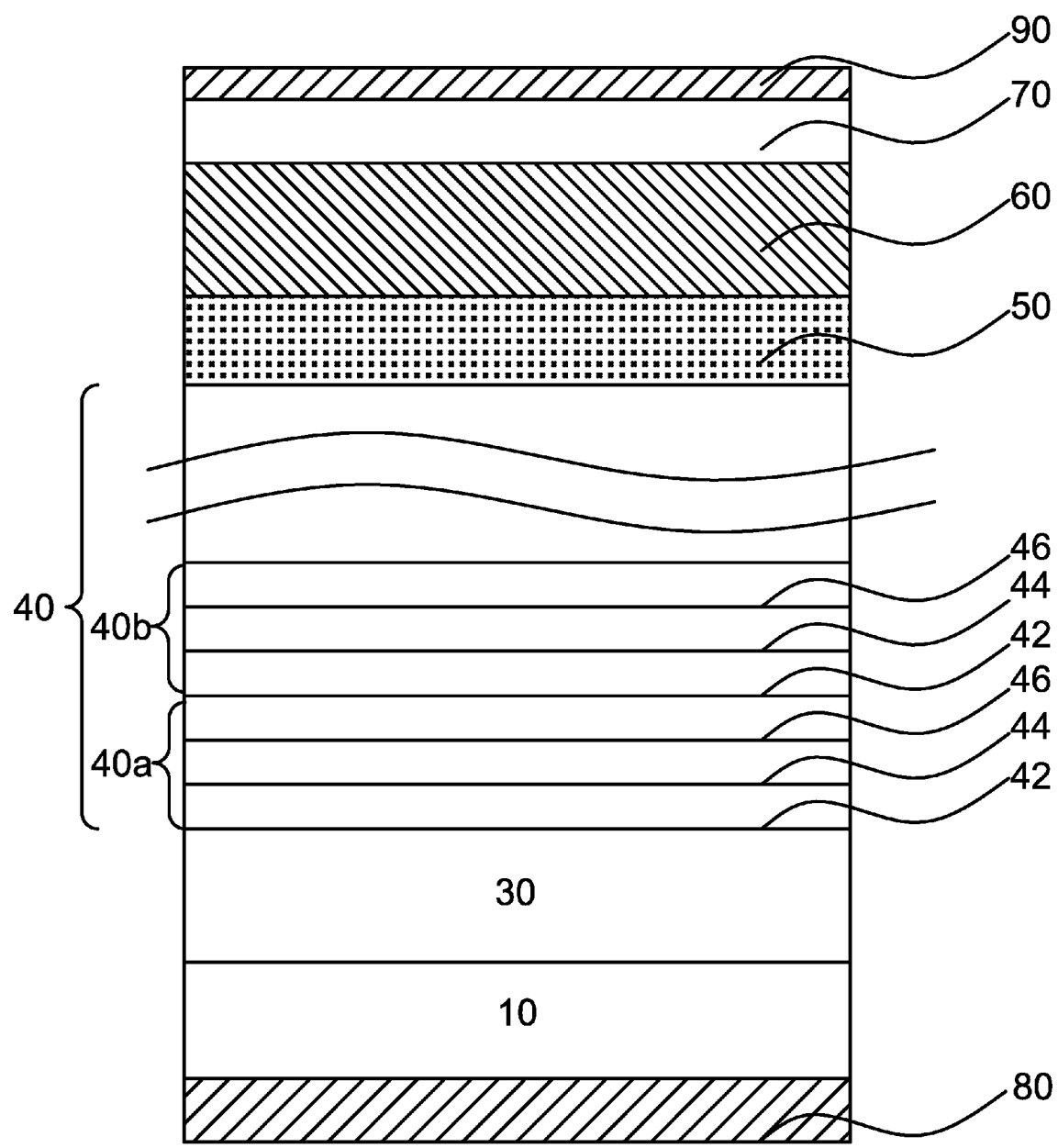
FIG. 6A and FIG. 6B are cross-sectional diagrams illustrating optoelectronic device in accordance with FIG. 4A and FIG. 4B.

FIG. 6A is a schematically cross-sectional diagram illustrating the optoelectronic device in accordance with FIG. 4A. In this embodiment, the formation and the structures of the substrate 10, the first semiconductor conductive layer 30, the multi-layer semiconductor structure layer 40, the active layer 50 and the second semiconductor conductive layer 60 are identical to the ones in FIG. 4A and not repeated herein.

As shown in FIG. 6A, an optoelectronic device includes: a first electrode 80, a substrate 10 on the first electrode 80, a first semiconductor conductive layer 30 on the substrate 10, a multi-layer semiconductor structure layer 40 between the first semiconductor conductive layer 30 and an active layer 50, a second semiconductor conductive layer 60 on the active layer 50, a transparent conductive 70 formed on the second semiconductor conductive layer 60, and a second electrode 90 formed on the transparent conductive 70.

In the embodiment, first, an epitaxy wafer, which performs the formation of the multi-layer semiconductor structure layer 40 on the substrate 10, is moved out from a reactor chamber of room temperature. Next, a mask pattern is transferred to the second semiconductor conductive layer 60 and then performed by reactive ion etching (RIE). Next, the transparent conductive layer 70 covers over the second semiconductor conductive layer 60 and have a thickness of about 2500 Angstroms. The material of the transparent conductive layer 70 is selected from the groups consisting of: Ni/Au, NiO/Au, Ta/Au, TiWN, TN, Indium Tin Oxide, Chromium Tin Oxide, Antinomy doped Tin Oxide, Zinc Aluminum Oxide and Zinc Tin Oxide.

Next, the second electrode 90 forms on the transparent conductive layer 70 and have a thickness of 2000 um. In the embodiment, the second semiconductor structure 60 is a P-type nitride semiconductor layer, and the second electrode 90 may be Au/Ge/Ni, Ti/Al, Tl/Al/Ti/Au or Cr/Au alloy or combination thereof. Finally, the first electrode 80 forms on the substrate 10, such as Au/Ge/Ni, Ti/Al, Tl/Al/Ti/Au, Cr/Au alloy or W/Al alloy. It is noted that the first electrode 80 and the second electrode 90 are formed by suitable conventional methods, which are not mentioned herein again.

Figure 6B:
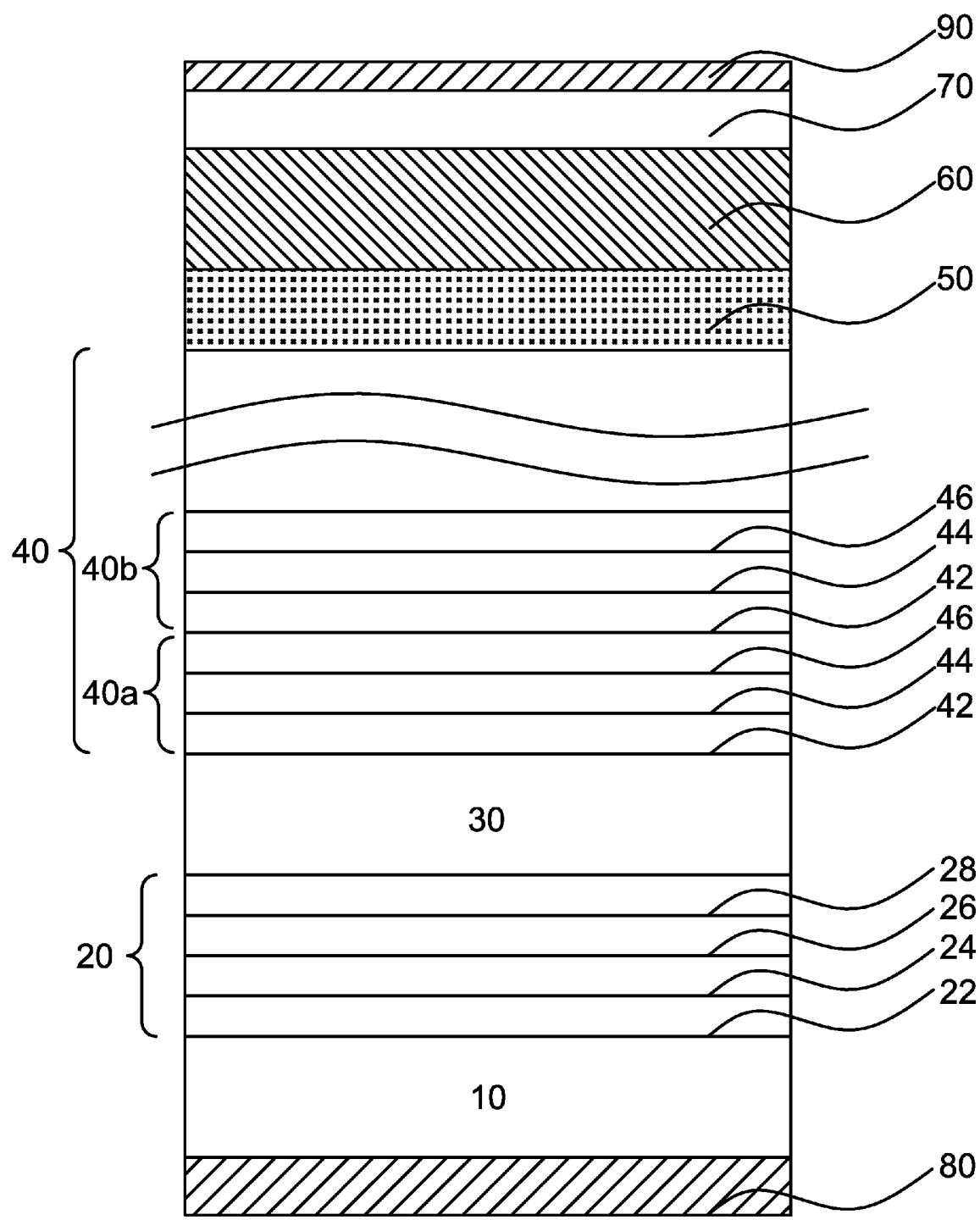

Next, FIG. 6B is a schematically cross-sectional diagram illustrating an epi-stacked structure of an optoelectronic device with a buffer layer 20 on a substrate 10 in accordance with the present invention. The optoelectronic device includes at least: a first electrode 80, a substrate 10 formed on the first electrode 80, a buffer layer 20 formed on the substrate 10, a first semiconductor conductive layer 30 formed on the buffer layer 20, a multi-layer semiconductor structure layer 40 formed on the first semiconductor conductive layer 30, an active layer 50 formed on the multi-layer semiconductor structure layer 40, a second semiconductor conductive layer 60 formed on the active layer 50, a transparent conductive layer 70 formed on the second semiconductor conductive layer 60 and a second electrode 90 formed on the transparent conductive layer 70.

Similarly, in the embodiment, the multi-layer semiconductor structure layer 40 includes a plurality of multi-layer structures 40a, 40b, 40c, or 40d (not shown in the figure). Each of the multi-layer structures is consisted of a first semiconductor structure layer 42, a second semiconductor structure layer 44 and a third semiconductor structure layer 46.

The average energy gap ($Eg_{(avg, SRS)}$) of the multi-layer semiconductor structure layer 40 (SRS: strain-releasing structure) shown in FIG. 6A or FIG. 6B may be acquired from the energy gaps of the first, second and third semiconductor structure layers 42, 44 and 46. For example, the first semiconductor structure layer 42 is with the first energy gap $Eg_1$ of 3.1 eV and the thickness $t_1$ of 1 nm, the second semiconductor structure layer 44 with the second energy gap $Eg_2$ of 3.657 eV and the thickness $t_2$ of 1.5 nm, and the third semiconductor structure layer 46 with the third energy gap $Eg_3$ of 3.34 eV and the thickness $t_3$ of 1 nm. Thus, the average energy gap ($Eg_{(avg,SRS)}$) of the multi-layer semiconductor structure layer 40 is calculated by the equation aforementioned to acquire the energy gap of 3.378 eV higher than the active layer 50 with the energy gap of 2.696 eV.

Figure 7A:
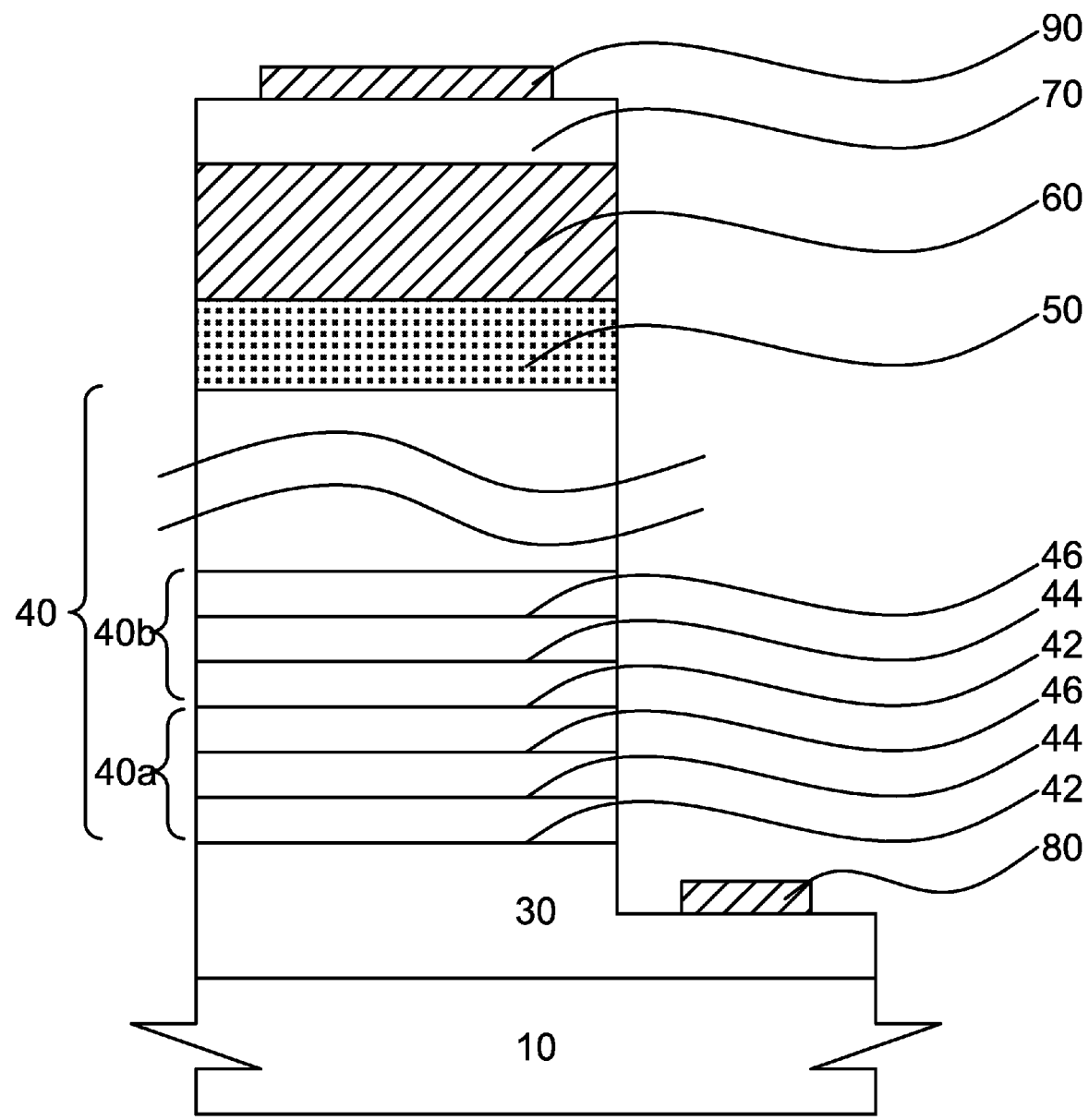
FIG. 7A and FIG. 7B are cross-sectional diagrams illustrating optoelectronic device in accordance with FIG. 5A and FIG. 5B.

Next, FIG. 7A is a schematically cross-sectional diagram illustrating an epi-stacked structure of an optoelectronic device in accordance with FIG. 5A. In FIG. 7A, the optoelectronic device includes: a substrate 10, a buffer layer 20, a multi-layer semiconductor structure layer 40, a transparent conductive layer 70, a first electrode 80 and a second electrode 90. The buffer layer 20 is formed on the substrate 10, and the multi-layer semiconductor structure layer 40 is formed on the buffer layer 20 and has a first portion and a second portion far away from the first one. The transparent conductive layer 70 is formed on the first portion of the multi-layer semiconductor structure layer 40. The first electrode 80 is formed on the second portion of the multi-layer semiconductor structure layer 40. The second electrode 90 is on the transparent conductive layer 70.

In the embodiment, after the formation of the epi-stacked structure, the portions of the second semiconductor conductive layer 60, the active layer 50 of the multi-layer semiconductor structure layer 40 and the first semiconductor conductive layer 30 are etched for removal to expose the portion (the second portion) first semiconductor conductive layer 30. Next, the transparent conductive layer 70 and the second electrode 90 are sequentially formed on the second semiconductor conductive layer 60. The first electrode 80 is formed on the exposed portion (second portion) of the first semiconductor conductive layer 30.

Figure 7B:
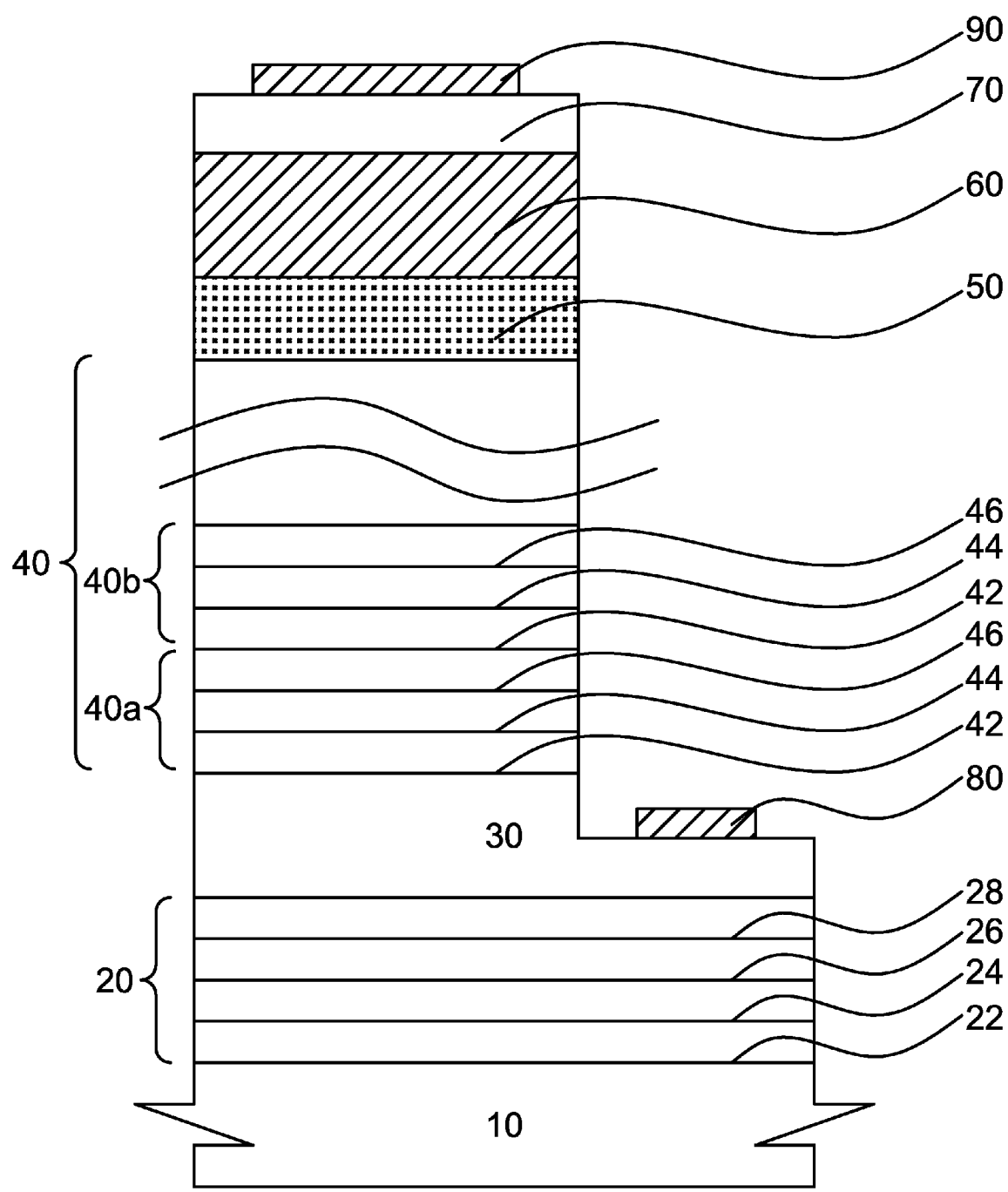

Next, FIG. 7B is a schematically cross-sectional diagram illustrating an epi-stacked structure of an optoelectronic device in accordance with FIG. 5B. In FIG. 7B, a substrate 10 and a buffer layer 20 on the substrate 10. The optoelectronic device includes: the substrate 10, the buffer layer 20, a multi-layer semiconductor structure layer 40, a transparent conductive layer 70, a first electrode 80 and a second electrode 90. The multi-layer semiconductor structure layer 40 is formed on the buffer layer 20. The epi-stacked structure has a first semiconductor conductive layer 30 with a first portion and a second portion far away from the first one. The multi-layer semiconductor structure layer 40 is formed on the first portion of the first semiconductor conductive layer 30 and the second portion of the first semiconductor conductive layer 30 being exposed. The active layer 50 is formed on the multi-layer semiconductor structure layer 40, the second semiconductor conductive layer 60 on the active layer 50, the transparent conductive layer 70 on the second semiconductor conductive layer 60, and the second electrode 90 on the transparent conductive layer 70.

In the embodiment, after the formation of the epi-stacked structure, the portions of the second semiconductor conductive layer 60, the active layer 50 of the multi-layer semiconductor structure layer 40 and the first semiconductor conductive layer 30 are removed to expose the portion (the second portion) first semiconductor conductive layer 30. Next, the transparent conductive layer 70 and the second electrode 90 are sequentially formed on the second semiconductor conductive layer 60. The first electrode 80 is formed on the exposed portion (second portion) of the first semiconductor conductive layer 30.

Figure 8:
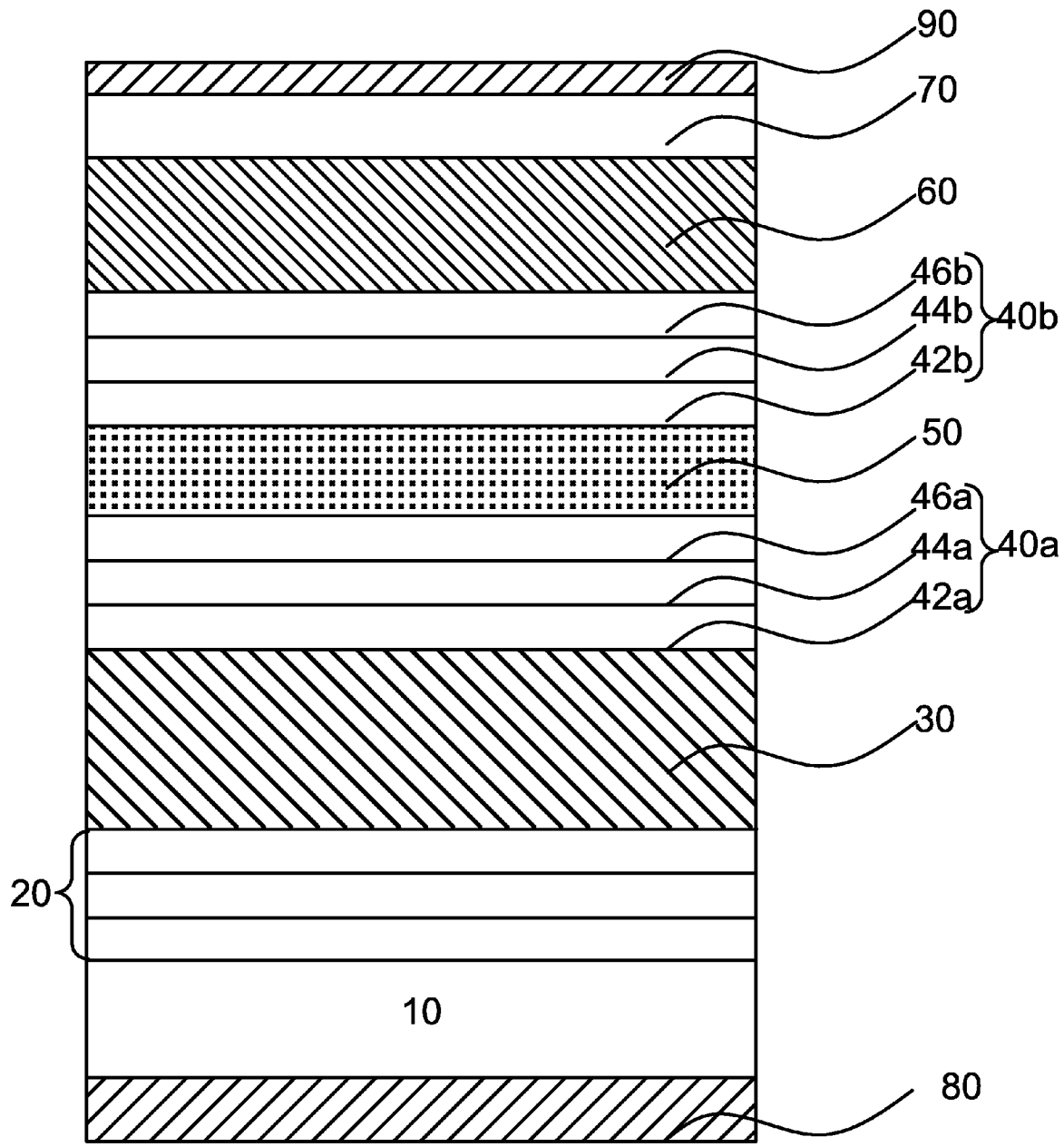
FIG. 8 is a cross-sectional diagram illustrating semiconductor structure with epi-stacked structures above and under an active layer in accordance with the present invention.

Next, FIG. 8 is a schematically cross-sectional diagram illustrating an epi-stacked structure of an optoelectronic device in accordance with the present invention. As shown in FIG. 8, the optoelectronic device includes: a first electrode 80, a substrate 10 formed on the first electrode 80, a buffer layer 20 formed on the substrate 10, a first semiconductor conductive layer 30 formed on the buffer layer 20, a multi-layer semiconductor structure layer 40 formed on the first semiconductor conductive layer 30, a first multi-layer semiconductor structure 40a formed on the first semiconductor conductive layer 30, an active layer 50 formed on the first multi-layer semiconductor structure 40a, a second semiconductor conductive layer 60 formed on a second multi-layer semiconductor structure 40b, a transparent conductive layer 70 formed on the second semiconductor conductive layer 60 and a second electrode 90 formed on the transparent conductive layer 70.

Figure 9:
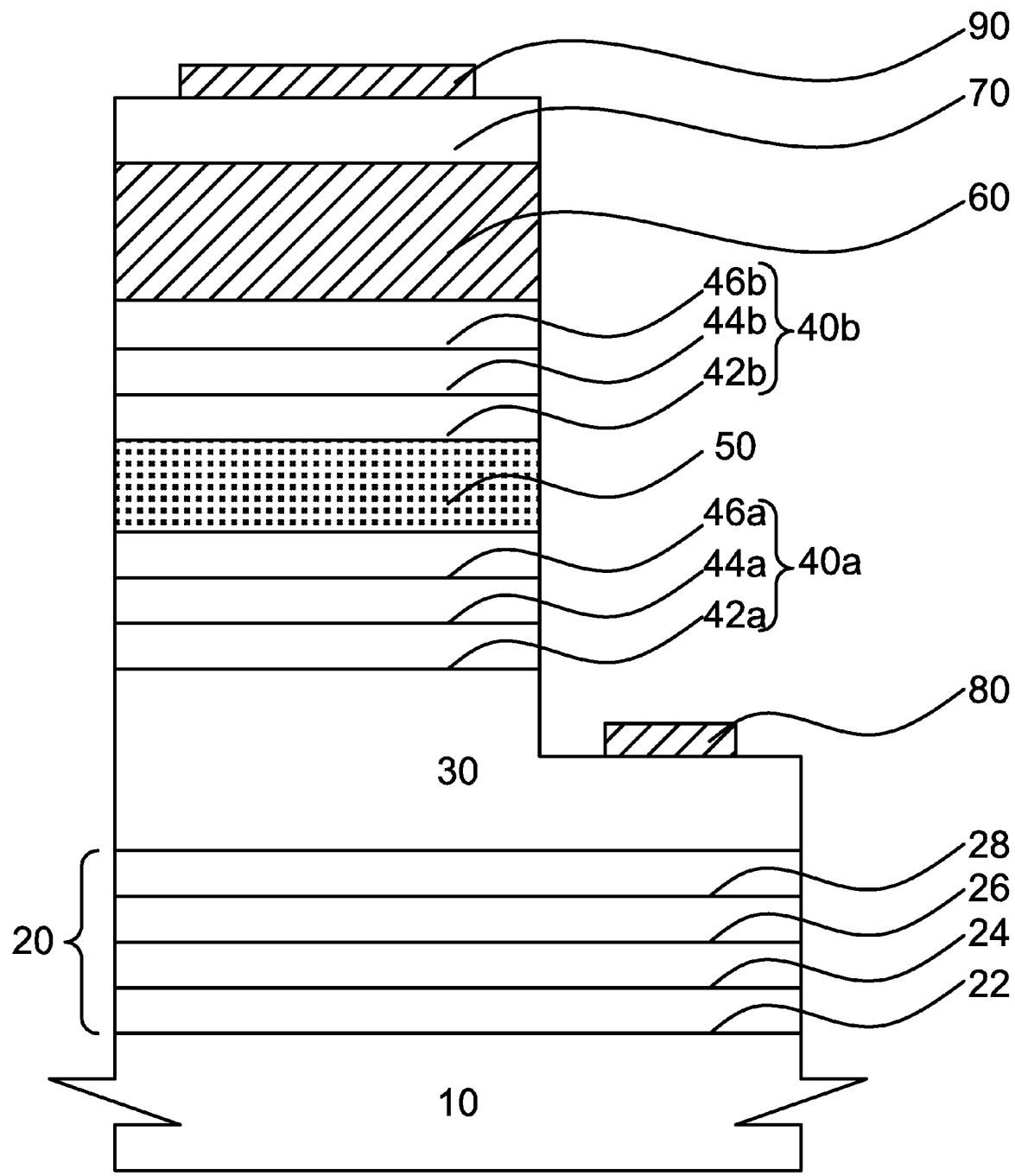
FIG. 9 is a cross-sectional diagram illustrating semiconductor structure with epi-stacked structures above and under an active layer in accordance with the present invention.

Next, FIG. 9 is a schematically cross-sectional diagram illustrating an epi-stacked structure of an optoelectronic device. In FIG. 9, the optoelectronic device includes: a substrate 10, a buffer layer 20, a first semiconductor conductive layer 30 with a first portion and a second portion formed on the buffer layer 20, a first multi-layer semiconductor structure 40a formed on the first portion of the first semiconductor conductive layer 30, an active layer 50 formed on the first multi-layer semiconductor structure 40a, a second multi-layer semiconductor structure 40b on the active layer 50, a second semiconductor conductive layer 60 formed on the second multi-layer semiconductor structure 40b, a transparent conductive layer 70 on the second semiconductor conductive layer 60, a first electrode 80 on the second portion of the first semiconductor conductive layer 30, and a second electrode 90 on the transparent conductive layer 70.

In the embodiments of FIG. 8 and FIG. 9, the first multi-layer semiconductor structure 40a and the second multi-layer semiconductor structure 40b are formed respectively above and under the active layer 50. The first multi-layer semiconductor structure 40a and the second multi-layer semiconductor structure 40b are consisted of the first semiconductor structure layers 42a/42b/second semiconductor structure layers 44a/44b/third semiconductor structure layers 46a/46b. In the embodiment, the first semiconductor structure layer 42a in the first multi-layer semiconductor structure 40a is an InGaN layer with the first energy gap of 3.1 eV and the thickness of 1.5 nm. The second semiconductor structure layer 44a is an AlGaN layer with the first energy gap of 3.647 eV and the thickness of 2 nm. The third semiconductor structure layer 46a is a GaN layer with the first energy gap of 3.34 eV and the thickness of 1 nm. The average energy gap ($Eg_{(avg,SRS)}$I) of the first multi-layer semiconductor structure 40a is 3.396 eV. Moreover, the second semiconductor structure layer 42b in the second multi-layer semiconductor structure 40b is an InGaN layer with the first energy gap (Eg) of 3.1 eV and the thickness of 1.5 nm. The second semiconductor structure layer 44b is an AlGaN layer with the first energy gap of 3.543 eV and the thickness of 1 nm. The third semiconductor structure layer 44c is a GaN layer with the first energy gap of 3.34 eV and the thickness of 1.5 nm. Thus, The average energy gap ($Eg_{(avg,SRS)}$I) of the second multi-layer semiconductor structure 40b is 3.30 eV. The energy gap (Eg) of the active layer 50 is 2.696 eV. Accordingly, the average energy gaps of the first and second multi-layer semiconductor structures 40a and 40b are different from the energy gap of the active layer 50. Thus, the light-emitting efficiency of the active layer 50 may be improved. And, the crystal mismatching between the active layer 50 and the first semiconductor conductive layer 30 is reduced.

Obviously, according to the illustration of embodiments aforementioned, there may be modification and differences in the present invention. Thus it is necessary to understand the addition of claims. In addition of detailed illustration aforementioned, the present invention may be broadly applied to other embodiments. Although the present invention has been explained in relation to its preferred embodiment, it is to be understood that other modifications and variation can be made without departing the spirit and scope of the invention as hereafter claimed.

What is claimed is:

1. An optoelectronic device with an epi-stacked structure, comprising:
 a substrate;
 a buffer layer formed on said substrate, said buffer layer comprising at least:
  a first nitride based compound layer on said substrate;
  a II/V group compound layer on said first nitride-containing compound layer;
  a second nitride-containing compound layer on said II/V group compound layer; and
  a third nitride-containing compound layer on said second nitride-containing compound layer; and
 an epi-stacked structure formed on said buffer layer, wherein said epi-stacked structure comprises:
  a first semiconductor conductive layer formed on said buffer layer;
  a multi-layer structure with an average energy gap ($Eg_{(avg,SRS)}$) formed on said first semiconductor conductive layer, the multi-layer structure comprising:
   a first semiconductor structure with an energy gap $Eg_1$ having a thickness t1;
   a second semiconductor structure with an energy gap $Eg_2$ having a thickness t2; and
   a third semiconductor structure with an energy gap $Eg_3$ sequentially stacked and having a thickness t3;
  wherein said average energy gap of the multi-layer structure satisfies $$Eg(avg, SRS) = \frac{(t_1 Eg_1 + t_2 Eg_2 + t_3 Eg_3)}{t_1 + t_2 + t_3};$$

an active layer with an energy gap ($Eg_{,active}$) formed on said multi-layer structure wherein said energy gap ($Eg_{,active}$) of said active layer is different from said average energy gap ($Eg_{(avg,SRS)}$) of said multi-layer structure; and
  a second semiconductor conductive layer formed on said active layer.

2. The optoelectronic device with the epi-stacked structure according to claim 1, wherein said second nitride-containing compound layer is an AlGaN layer.

3. The optoelectronic device with the epi-stacked structure according to claim 1, wherein said third nitride-containing compound layer is an $Al_xIn_yGa_{1-x-y}N$ layer.

4. The optoelectronic device with the epi-stacked structure according to claim 1, wherein said first semiconductor conductive layer comprises at least a first portion and an exposed second portion.

5. The optoelectronic device with the epi-stacked structure according to claim 1, wherein said multi-layer semiconductor structure layer comprises a plurality of multi-layer semiconductor structures.

6. The optoelectronic device with the epi-stacked structure according to claim 1, wherein said active layer is selected from the groups consisting of: InGaN layer, multi quantum well (MQW) and a quantum well (QW).

7. An optoelectronic device with a multi-layer structure, comprising:
 a substrate;
 an epi-stacked structure formed on said substrate, wherein said epi-stacked structure comprises:
  an active layer with an energy gap ($Eg_{,active}$)
  a multi-layer structure with an average energy gap ($Eg_{(avg,SRS)}$) the multi-layer structure comprising:
   a first semiconductor structure with an energy gap $Eg_1$ having a thickness t1;
   a second semiconductor structure with an energy gap $Eg_2$ having a thickness t2; and
   a third semiconductor structure with an energy gap $Eg_3$ sequentially stacked and having a thickness t3;
  wherein said average energy gap of multi-layer structure satisfies $$Eg(avg, SRS) = \frac{(t_1 Eg_1 + t_2 Eg_2 + t_3 Eg_3)}{t_1 + t_2 + t_3},$$

and said energy gap ($Eg_{,active}$) of said active layer is different from said average energy gap ($Eg_{avg,SRS}$) of said multi-layer structure.

8. The optoelectronic device with the multi-layer structure according to claim 7, said multi-layer structure are undoped components.

9. The optoelectronic device with the multi-layer structure according to claim 7, wherein the first semiconductor structure, the second semiconductor structure and the third semiconductor structure are respectively GaN layer, AlGaN layer and InGaN layer.

10. The optoelectronic device with the multi-layer structure according to claim 7, wherein the multi-layer structure formed over the active layer.

11. The optoelectronic device with the multi-layer structure according to claim 7, wherein the multi-layer structure formed below the active layer.

* * * * *